United States Patent
Tan et al.

(10) Patent No.: US 11,822,395 B2
(45) Date of Patent: Nov. 21, 2023

(54) INFORMATION HANDLING SYSTEM THERMAL AND EMI ENCLOSURES

(71) Applicant: Dell Products L.P., Round Rock, TX (US)

(72) Inventors: Geroncio Tan, Austin, TX (US); Changsoo Kim, Cedar Park, TX (US); Suresh Ramasamy, Cedar Park, TX (US); Timothy C. Shaw, Austin, TX (US); Salvador D. Jimenez, III, Leander, TX (US); Pomin Shih, Beitou Dist. (TW); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 209 days.

(21) Appl. No.: 17/390,538

(22) Filed: Jul. 30, 2021

(65) Prior Publication Data
US 2023/0035512 A1 Feb. 2, 2023

(51) Int. Cl.
*H05K 9/00* (2006.01)
*G06F 1/18* (2006.01)

(52) U.S. Cl.
CPC ............ *G06F 1/182* (2013.01); *H05K 9/0092* (2013.01)

(58) Field of Classification Search
CPC ................. G06F 1/182–185; H05K 9/0092
USPC .......................................... 361/799, 816, 818
See application file for complete search history.

(56) References Cited

U.S. PATENT DOCUMENTS

| | | | |
|---|---|---|---|
| 5,515,230 A | 5/1996 | Ashley | |
| RE36,845 E | 8/2000 | Huppenthal et al. | |
| 7,658,901 B2 | 2/2010 | Prud'Homme et al. | |
| 7,746,666 B2 * | 6/2010 | Kakinoki | H05K 9/0032 361/818 |
| 7,841,897 B2 | 11/2010 | Blake et al. | |
| 8,570,178 B2 | 10/2013 | Awrence et al. | |
| 8,576,569 B2 * | 11/2013 | Malek | H05K 3/32 361/730 |
| 8,711,574 B2 * | 4/2014 | Kobayashi | H05K 9/006 361/799 |
| 9,536,840 B2 | 1/2017 | Du | |
| 9,624,379 B2 | 4/2017 | Do et al. | |
| 9,640,531 B1 | 5/2017 | Or-Bach et al. | |
| 2015/0131220 A1 * | 5/2015 | Degner | G06F 1/1658 361/679.09 |

(Continued)

FOREIGN PATENT DOCUMENTS

| | | | | |
|---|---|---|---|---|
| CN | 211647063 | * | 10/2020 | ............ E04F 13/075 |
| CN | 218666353 | * | 3/2023 | ............. C25D 13/12 |
| JP | 3224659 | * | 12/2019 | ........... H01R 13/533 |

*Primary Examiner* — Hung S. Bui
(74) *Attorney, Agent, or Firm* — ZAGORIN CAVE LLP; Robert W. Holland

(57) ABSTRACT

An information handling system EMI shield system couples to a circuit board to enclose an electronic device in a Faraday cage and includes a surface painted with a graphene paint to aid in dissipation of excess thermal energy from the electronic device. The EMI shield system has a frame that couples to the circuit board and interfaces with ground to define a boundary around an electronic device connector and has a shield that couples as a separate piece over the frame to enclose the electronic device. Graphene paint applied to some or all of the shield encourages rejection of excess thermal energy from within shield.

20 Claims, 11 Drawing Sheets

(56) References Cited

U.S. PATENT DOCUMENTS

2017/0164498 A1\* 6/2017 Song ................... H05K 9/0032
2018/0152549 A1   5/2018 Hobson et al.
2018/0277279 A1   9/2018 Brereton et al.
2020/0168572 A1   5/2020 Lin et al.
2023/0029875 A1\* 2/2023 Tan ....................... G06F 1/1698

\* cited by examiner

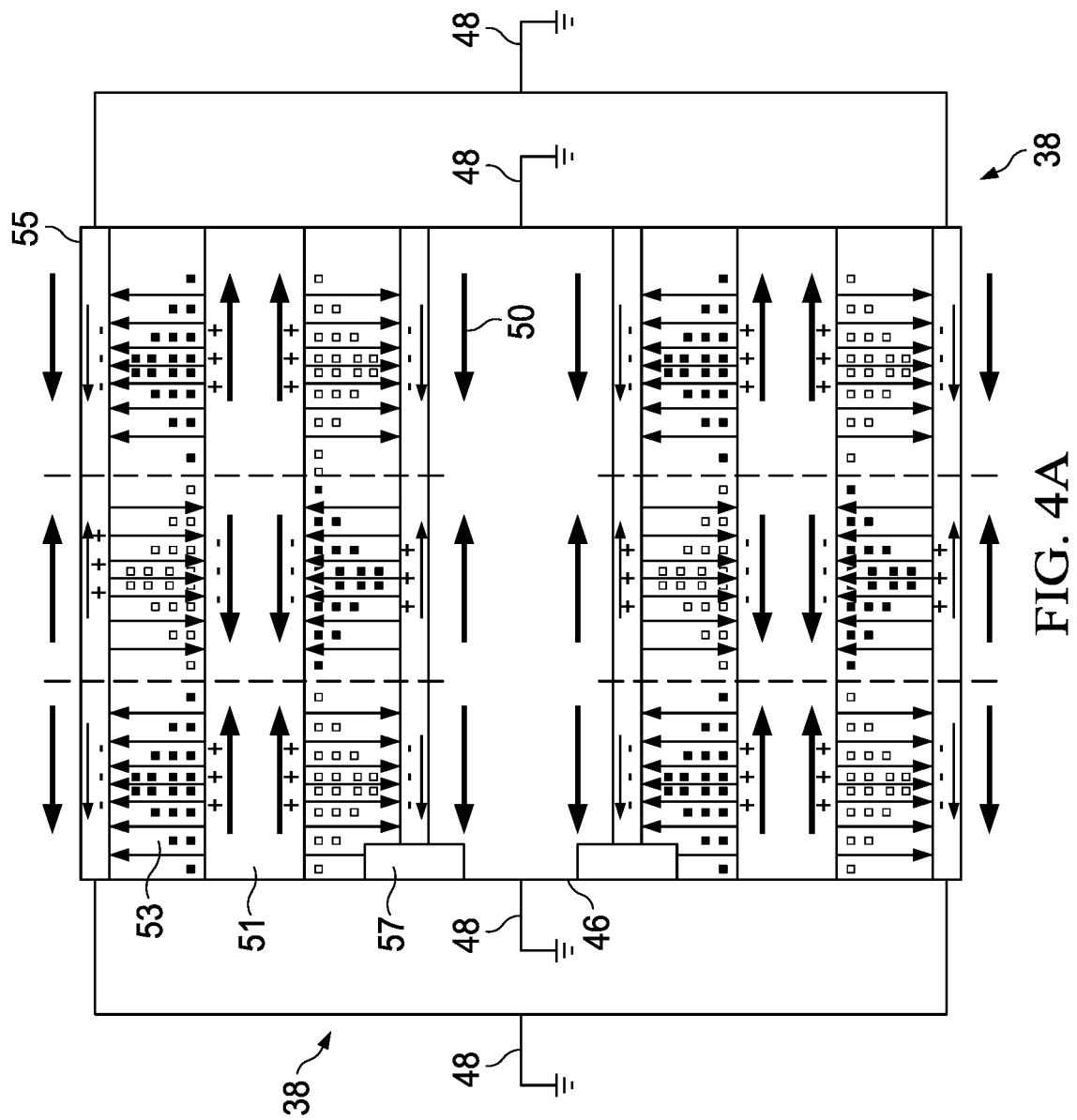

INFORMATION HANDLING SYSTEM THERMAL AND EMI ENCLOSURES

BACKGROUND OF THE INVENTION

Field of the Invention

The present invention relates in general to the field of information handling system component communications, and more particularly to an information handling system thermal and EMI enclosures.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components disposed in a housing. Desktop information handling systems tend to have larger stationary housings that provide room internally to distribute components for improved thermal and electromagnetic interference (EMI) management. Portable information handling systems integrate processing components, a display and a power source in a portable housing to support mobile operations that are typically smaller than a desktop system. Portable information handling systems allow end users to carry a system between meetings, during travel, and between home and office locations so that an end user has access to processing capabilities while mobile, such as in a tablet or convertible configuration. Tablet portable information handling systems typically expose a touchscreen display on a planar housing that both outputs information as visual images and accepts inputs as touches. Convertible portable information handling systems typically include multiple separate housing portions that couple to each other so that the system converts between closed and open positions. For example, a main housing portion integrates processing components and a keyboard and rotationally couples with hinges to a lid housing portion that integrates a display. In a clamshell position, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Portable information handling systems tend to rely on wireless communication to support operations, particularly when an end user is mobile. Generally portable information handling systems include a wireless personal area network (WPAN) radio to support interactions with peripheral devices, such as a Bluetooth or 60 GHz radio, and a wireless local area network (WLAN) radio to support Internet interactions, such as in the 2.4 GHz and 5 GHz bands. More recently, information handling systems have begun to include 5G wireless wide area network (WWAN) radios to support communications through mobile telephone networks. 5G wireless communication provides excellent bandwidth in a mobile platform with wireless signals sent through an array of at least 6 antennas interfaced with the 5G radio through coaxial cables. High data rates associated with 5G radios can introduce crosstalk with dissimilar types of radios in the information handling system that can disrupt signal strength. A good engineering practice is to avoid overlapping antenna coaxial cables for the various radios to prevent any surface currents of the cables from generating interference. However, with small housing footprints and increased numbers of antennas, routing cables with adequate spacing can present a challenge. Further, housing size and ID constraints, such as a trend towards zero border displays, tend to limit the placement of radio antenna to a base of the system.

In addition to the difficulty of routing cables, 5G radios have introduced challenges in managing EMI related to wireless signal transmissions and thermal energy associated with increased radio power dissipation. Digital circuits related to wireless communication are inherently noisy due to fast rise times and the square shape of waveform, which tends to generate infinite harmonics. To ensure proper operation, such radios tend to need EMI shielding and isolation of noisy circuits and components. Generally, radios are shielded with Faraday cages of a conductive material that cancel external noise from entering a radio located in the cage interior. However, for improved serviceability, many radios are in module form, which makes them difficult to effectively shield. Further, six-sided Faraday cages tend to retain thermal energy of the radio, which can be substantial where a typical radio may operate at peak power of 8 W. Small form factor housings have difficulty rejecting excess thermal energy or processing components, such as processors and memory, so that introducing additional thermal energy from radio operations can constrain full processing power operations of processing components disposed within the housing.

SUMMARY OF THE INVENTION

Therefore, a need has arisen for a system and method which provides and manages crosstalk between coaxial cables of an information handling system when routed in proximity to each other.

A further need exists for a system and method that shields electromagnetic interference (EMI) associated with operation of an electronic device while managing thermal energy generated by operation of the electronic device.

In accordance with the present invention, a system and method are provided which substantially reduce the disadvantages and problems associated with previous methods and systems to manage crosstalk between coaxial cables of an information handling system when routed in proximity to each other. A cable clip interfaced with system ground routes coaxial cables of different radios and different transmission frequencies by exposing a ground sheath of the coaxial cables at the cable clip to reduce coaxial cable surface current.

A further system and method are provided to manage EMI and thermal energy generated by an electronic device in an information handling system housing. An EMI shield system encloses an electronic device is a conductive structure interfaced with ground to manage EMI leakage and coated in graphene paint to aid in dissipation of excess thermal energy out of the EMI shield to maintain thermal constraints of the electronic device.

More specifically, an information handling system processes information with a processor and memory disposed in a housing and communicates the information external the housing with plural radios operating at plural frequencies through plural antennas. The plural radios interface with the plural antennas through plural coaxial cables routed in the housing with one or more cable clips having a conductive material and coupled to system ground, such as through a motherboard. The coaxial cables expose a ground sheath from under an outer covering at a coupling point with the cable clips to reduce crosstalk that can occur at the coaxial cable outer surface where reflections from the antenna pass through the cable ground sheath and disrupt radio signals of nearby dissimilar frequency coaxial cables. In one embodiment, an in phase current is applied at the coaxial cable outer surface to help cancel reflection noise that can leak from the coaxial cable. In order to manage EMI associated with a radio or other electronic device, such as a solid state drive, a frame couples to a circuit board around the radio and interfaces with ground. A shield couples to the frame to enclose the radio in a Faraday cage that restricts leakage of undesired EMI. A graphene paint applied to the shield helps to dissipate excess thermal energy from within the enclosure defined by the frame and shield over the radio.

The present invention provides a number of important technical advantages. One example of an important technical advantage is that coaxial cables carrying dissimilar radio signals may be routed more closely together, such as by sharing a common clip having separate portions in which coaxial cables stack vertically. Reduced spacing between coaxial cables provides a more compact placement of information handling system components within a housing and supports multiple antennas for each of multiple radios, such as are used for MIMO and 5G WWAN communication systems. Reduced crosstalk between dissimilar radio signals where cables are placed in proximity to each other improves radio transmission and reception performance. The graphene coated shield provides effective EMI and thermal management that also supports a more compact disposition of components in the housing. For example, the high thermal conductivity of graphene removes thermal energy with efficiency and graphene offer 15% better emissivity than aluminum. In one example embodiment, a graphene coating on a WWAN radio shield reduces they system CPU operating temperature by 2 degrees Celsius while EMI levels are reduced from −90 dBa to −126 dBa.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 4, 4A, and 4B depict circuit diagrams of an example of coaxial cable ground management to reduce radio signal crosstalk;

DETAILED DESCRIPTION

An information handling system radio interfaces with antennas through coaxial cables having a ground sheath interface with a grounded cable clip to reduce crosstalk between dissimilar signals. The radio has a graphene coated shield that aids in dissipation of thermal energy from the radio within the shield enclosure. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
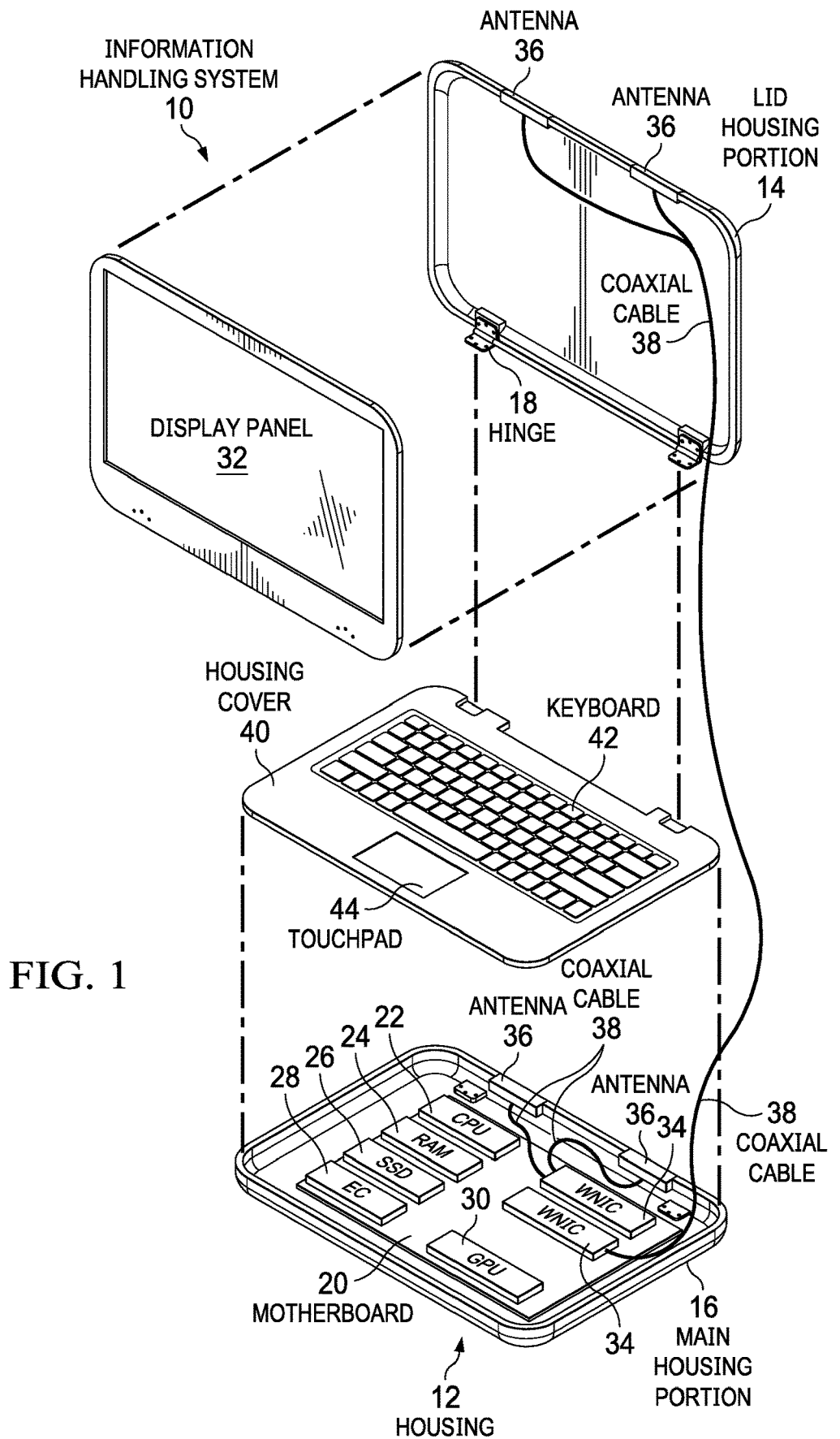
FIG. 1 depicts an exploded perspective view of an information handling system having plural radios interfaced with plural antennas.

Referring now to FIG. 1, an exploded perspective view depicts an information handling system 10 having plural radios interfaced with plural antennas 36. In the example embodiment, information handling system 10 is built in a portable housing 12 having a lid housing portion 14 rotationally coupled to a main housing portion 16 by a hinge 18 to rotate between open and closed positions. A motherboard 20 couples to main housing portion 16 to support communication between processing components that cooperate to process information. For example, a central processing unit (CPU) 22 executes instructions to process information by communication with a random access memory (RAM) 24 that stores the instructions and information. A solid state drive (SSD) 26 provides persistent storage during power down of the system, such as an operating system and applications that are retrieved at power up to RAM 24 for execution on CPU 22. An embedded controller 28 manages operating constraints of the processing components, such as the application of power to the processing components and the maintenance of thermal constraints. A graphics processing unit (GPU) 30 interfaces with CPU 22 to further process information to generate pixel values that define visual images for presentation at a display panel 32 that couples to lid housing portion 14. Plural wireless network interface cards (WNIC) each include one or more radios that communicate with external radios through wireless signals. WNICs 34 interface with plural antenna through coaxial cables 38 to received and transmit wireless signals, as is described in greater detail below. A housing cover 40 couples over main housing portion 16 to protect the processing components and includes a keyboard 42 and touch pad 44 that accept end user inputs.

In various embodiments, WNICs 34 provide wireless communication with a plurality of different frequency bands, communication protocols and antenna configurations. For example, WNIC 34 may support wireless wide area networks (WWAN) that communicate through mobile telephone networks, such as with the 5G protocol. As another example, WNIC 34 may support wireless local area networks (WLAN), such as 802.11(b, g, n) protocols that operate in the 2.4 GHz and 5 GHz bands. As yet another example, WNIC 34 may support wireless personal area networks (WPAN) that operate in the 2.4 GHz and 60 GHz bands, such as the Bluetooth and WiGig protocols. To optimize radio performance, one or more WNICs 34 may communicate the wireless signals through an array of antenna 36, such as plural antenna 36 that communicate in a MIMO configuration that uses directional control of wireless communication parameters to enhance antenna transmit and receive sensitivity. In a WLAN communication system, main and auxiliary antenna are sometimes used with each having a coaxial cable interface to the WLAN radio. Generally, to support MIMO or similar multi-antenna communications, WNIC 34 has a coaxial cable 38 that interfaces with each antenna used. In the example embodiment, some antenna 36 are deployed in lid housing portion 14, such as by running coaxial cables 38 across hinge 18. Although antenna 36 in lid housing portion 14 can enhance wireless communication with a raised antenna relative to main housing portion 16, where display 32 has an edge-to-edge configuration with a minimal bezel around its perimeter, placement of antenna may not be practical due to space constraints. In such situations, a large number of antenna 36 may be placed in main housing portion 16, such as ten antenna to support a typical wireless communication configuration, with each antenna 36 interfaced to a WNIC 34 by a coaxial cable 38. When WNICs 34 and antenna 36 crowd into a small footprint, such as is often the case with portable information handling system main housing portions 16, crosstalk between coaxial cables 38 may occur due to proximity that can impact the sensitivity of radios that communicate wireless signals.

Figure 2:
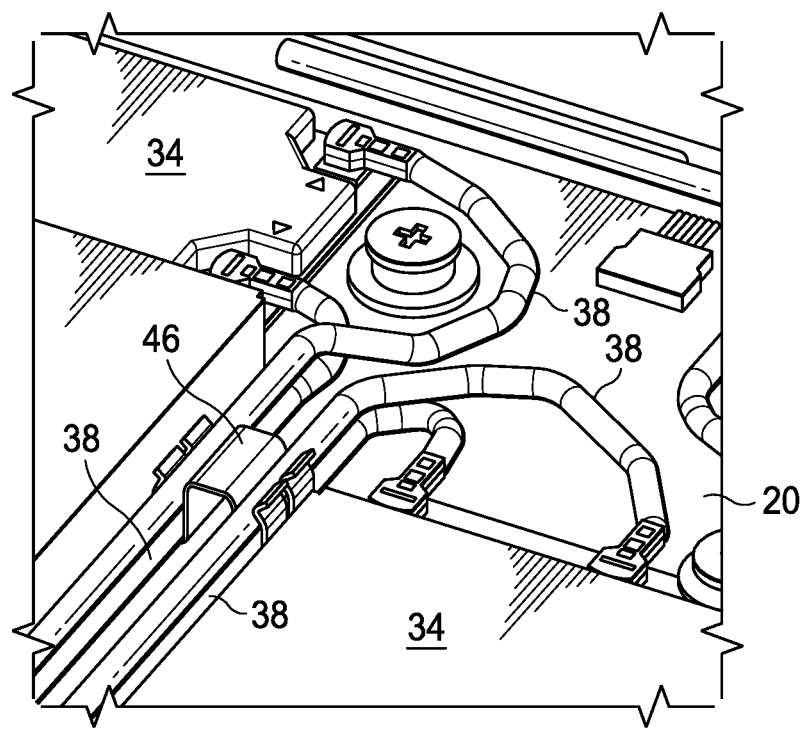
FIG. 2 depicts an upper perspective view of plural WNICs coupled to a motherboard and interfaced with plural antenna through plural coaxial cables coupled in place by one or more cable clips.

Referring now to FIG. 2, an upper perspective view depicts plural WNICs 34 coupled to a motherboard 20 and interfaced with plural antenna through plural coaxial cables 38 coupled in place by one or more cable clips 46. For example, a first of the WNICs 34 supports WLAN communication with first and second coaxial cables 38 that support communication with a main and auxiliary radio. A second of the WNICs 34 supports WWAN communication with first and second coaxial cables 38 that support communication to first and second antenna of a MIMO configuration. In the small footprint main housing portion of the example embodiment, insufficient space exists to route the WLAN and WWAN antenna apart from each other so that the proximity of coaxial cables 38 carrying dissimilar frequency signals can result in crosstalk due to signal leakage at the exterior surface of the coaxial cables. To reduce the risk of crosstalk, coaxial cables 38 are routed through a cable clip 46 having a first portion to accept the WWAN coaxial cables and a second portion to accept the WLAN coaxial cables. As is set forth in greater detail below, cable clip 46 interfaces with ground at motherboard 20 and interfaces with a ground sheath of one or more of coaxial cables 38 to neutralize surface currents of the coaxial cables that can aggravate crosstalk.

Figure 3:
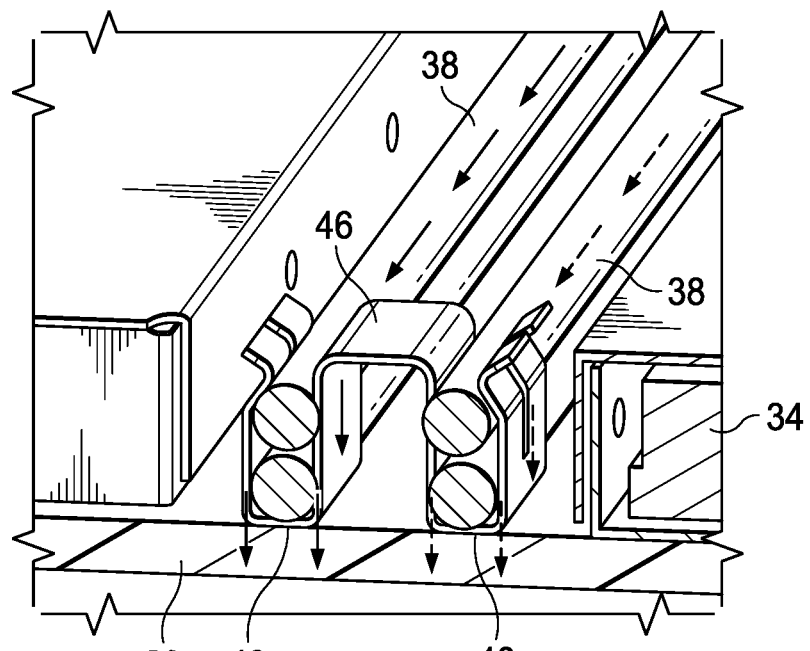
FIG. 3 depicts a side sectional view of plural coaxial cables coupled to a cable clip having a ground interface to help manage coaxial cable crosstalk.

Referring now to FIG. 3, a side sectional view depicts plural coaxial cables 38 coupled to a cable clip 46 having a ground 48 interface to help manage coaxial cable crosstalk. For example, cable clip 46 is constructed of a conductive material, such as copper, that couples to motherboard 20 with a conductive interface to the system ground plane of motherboard 20. Coaxial cables 38 have an outer cover placed over an inner ground sheath, such as a mesh of copper, that shields a central conductor encased in a dielectric. Communication of a wireless signal between a radio and antenna is performed through the central conductor and shielded by the ground sheath to minimize interference with the radio signal. However, some electric and magnetic fields may extend beyond the ground sheath that introduce EMI external to the coaxial cable. Further, as radio signals transmit from an antenna, reflections of the signal pass to ground may generate surface currents at the cover disposed over the ground sheath. In order to help minimize these surface current effects, the ground sheath is exposed at the coaxial cable insertion to cable clip 46 so that the coaxial cable ground sheath interfaces with system ground 48 through conductive material of cable clip 46. In the example embodiment, one portion of cable clip 46 vertically stacks first and second coaxial cables 38 of a WWAN radio and the other portion of cable clip 46 vertically stacks first and second coaxial cables 38 or a WLAN radio.

Figure 4:
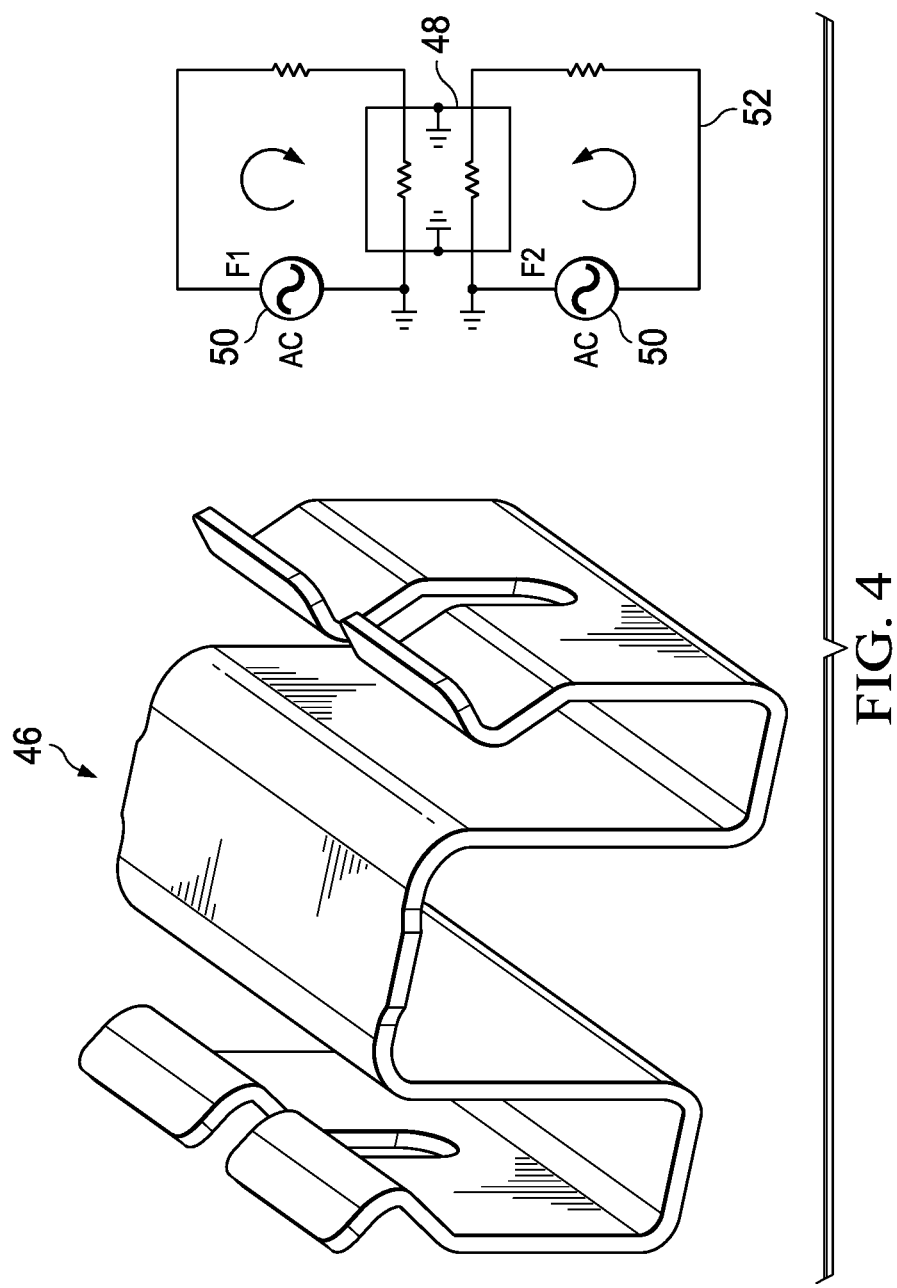
Figure 4B:
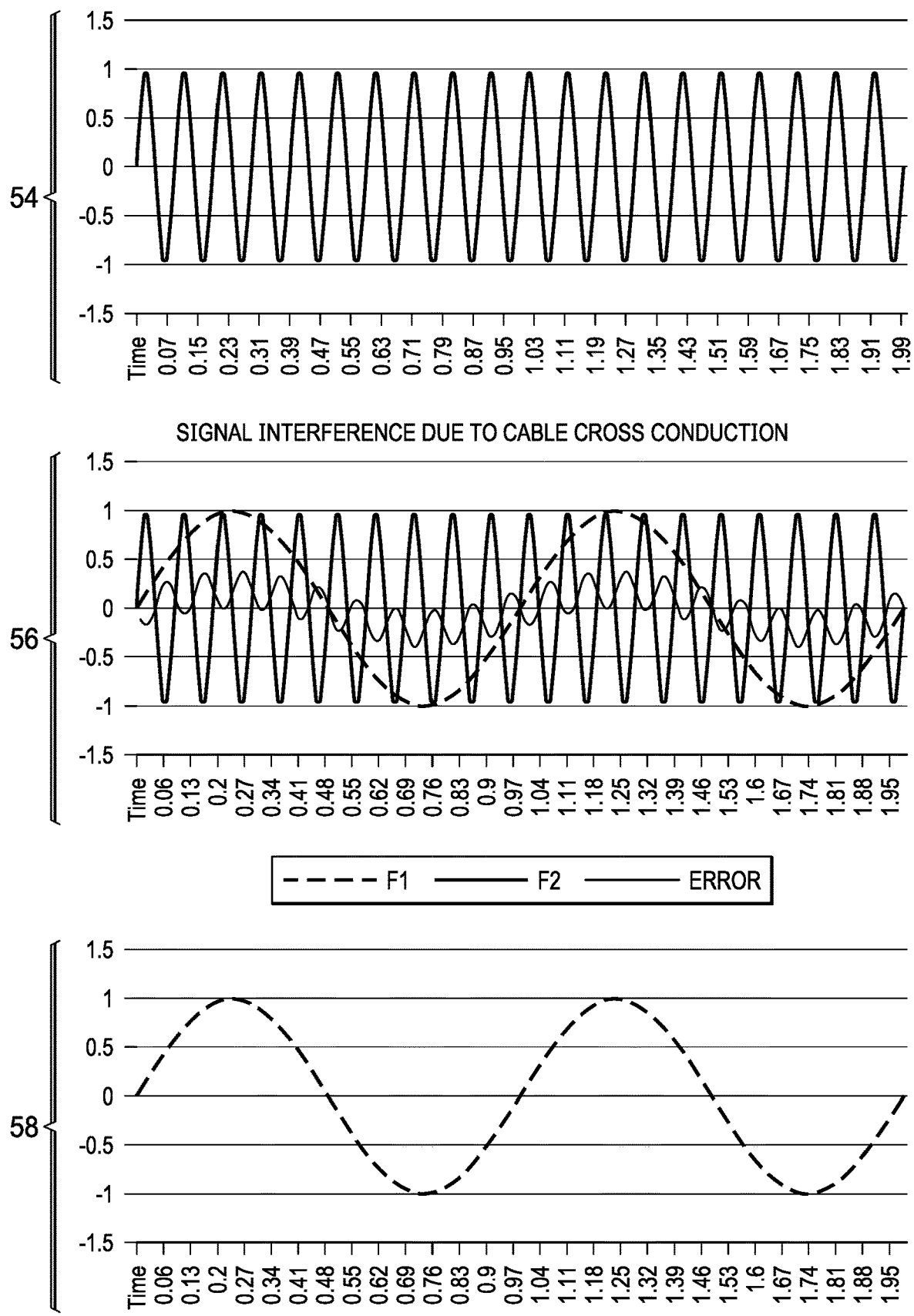

Referring now to FIGS. 4 and 4A, circuit diagrams depict an example of coaxial cable ground management to reduce radio signal crosstalk. In the example embodiment, a first radio 50 generates a signal 54 having a higher frequency than a second radio 50 signal 58. For instance, the first radio 50 is a WLAN radio that communicates at 2.4 GHz and the second radio communicates at lower frequency associated with 5G WWAN signals. The wave form 56 illustrates that a summation of the signal 54 and 58 provided through crosstalk can result in wave form peaks and bottoms that fall outside of constraints distinguishable by radios 50. Cable clip 46 moderates the impact of crosstalk for the signal of a coaxial cable conductor by defining a circuit 52 that shares system ground 48 with the ground sheath of each coaxial cable, thereby reducing surface currents at the exterior cover of the coaxial cables. The example embodiment depicts a cable clip 46 having first and second portions to accept first and second pairs of coaxial cables, however, alternative embodiments may have more than two portions and may couple more than two coaxial cables per portion.

FIG. 4A illustrates an alternative embodiment of the cable clip 46 configured to cancel surface currents associated with coaxial cables 38. As is described above, a conductor 51 enclosed in a dielectric communicates the radio signals with the antenna as an alternating current signal having related electric field, magnetic field and voltage characteristics. A ground sheath 53 disposed around conductor 51 limits passage of signal exterior to coaxial cable 38 and an outer cover 55 insulates ground sheath 53. The outer cover 55 is removed at a ground interface 57 so that ground sheath 53 contacts system ground 48 through cable clip 46 to reduce surface currents at outer cover 55. In addition, current is added at outer cover 55 in phase to help cancel the outer cover currents, such as ground reflections from antenna ground. In the example embodiment, an in phase current is provided by a clock of radio 50 that, for instance, generates the radio output. In alternative embodiments, the current added at the outer cover 55 may be set based upon the type of current detected at the outer cover, such as with a feedback system that actively adjusts the added current to cancel outer cover currents. Although outer cover 55 is typically an insulative material, in one embodiment a conductive material might be added to better conduct the outer surface cancellation current between cable clip 46 system grounds 48.

Figure 5:
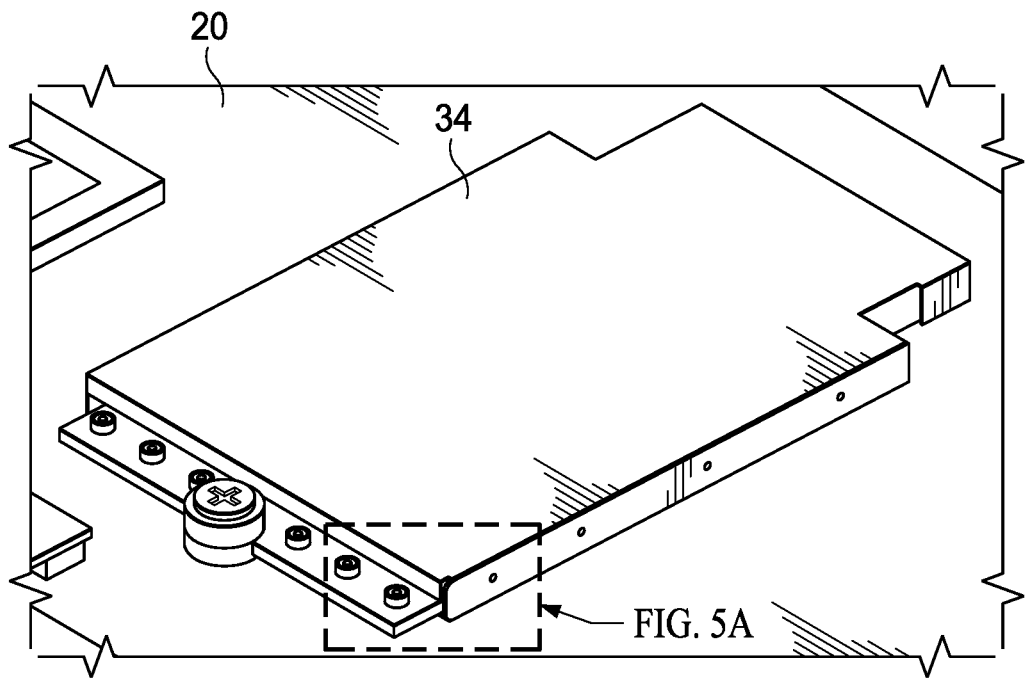
FIGS. 5, 5A, 5B, 5C and 5D depict an example embodiment of an electromagnetic interference (EMI) shield system having a multi-portion assembly and ground interface.
Figure 5A:
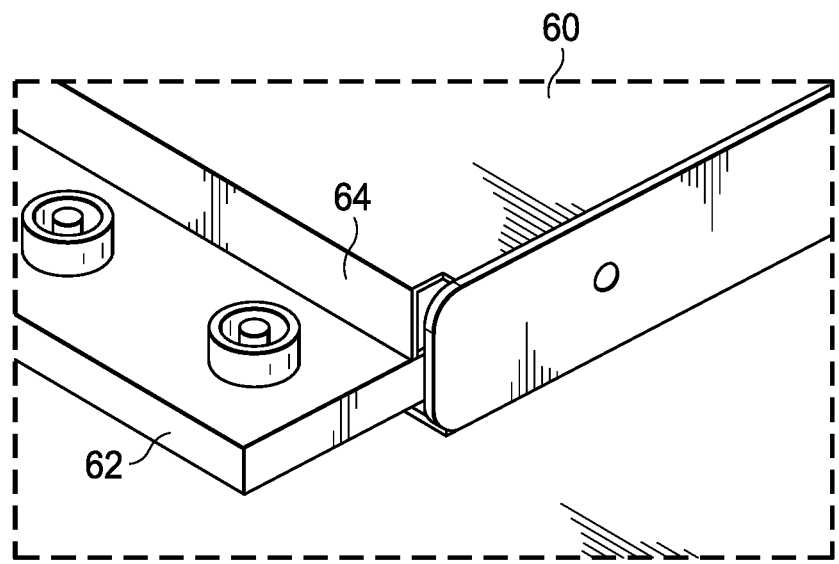

Referring now to FIGS. 5, 5A, 5B, 5C and 5D, an example embodiment of an electromagnetic interference (EMI) shield system is depicted having a multi-portion assembly and ground interface. FIG. 5 depicts an upper perspective view of a motherboard 20 having a WNIC 34 mounted at an upper surface and covered by an EMI shield system as further detailed by FIGS. 5A through 5D. Placing an electronic device under an EMI shield system, such as a WWAN radio as depicted by FIG. 5, can result in a buildup of thermal energy within the enclosure and increased temperatures within the information handling system housing. To help manage thermal conditions associated with the electronic device and within the EMI shield system, some or all portions of the shield is painted with a graphene based paint. The graphene paint may be applied uniformly across the EMI shield system, on just an interior surface within the enclosure where the radio resides, on just the exterior surface that is exposed to the air within the housing or at different surfaces. As an example, the density of graphene in the paint and thickness of the paint may vary at different surface areas to adapt to a thermal profile of an electronic device within the EMI shield system, such as having greater graphene density where heat exposure is greatest. FIG. 5A depicts a detailed view of a shield 60 that couples over an electronic device at a device connector 62 coupled to motherboard 20. A front face 64 of shield 60 folds down over an enclosed electronic device and against the upper surface of connector 62 to reduce EMI leakage. As is described below in greater detail, a snug fit of a grounded conductive shield material around the electronic device helps to reduce EMI leakage. In the example embodiment, front face 64 folds down to touch a grounded portion of connector 62 and/or of the electronic device where it couples to connector 62.

Figure 5B:
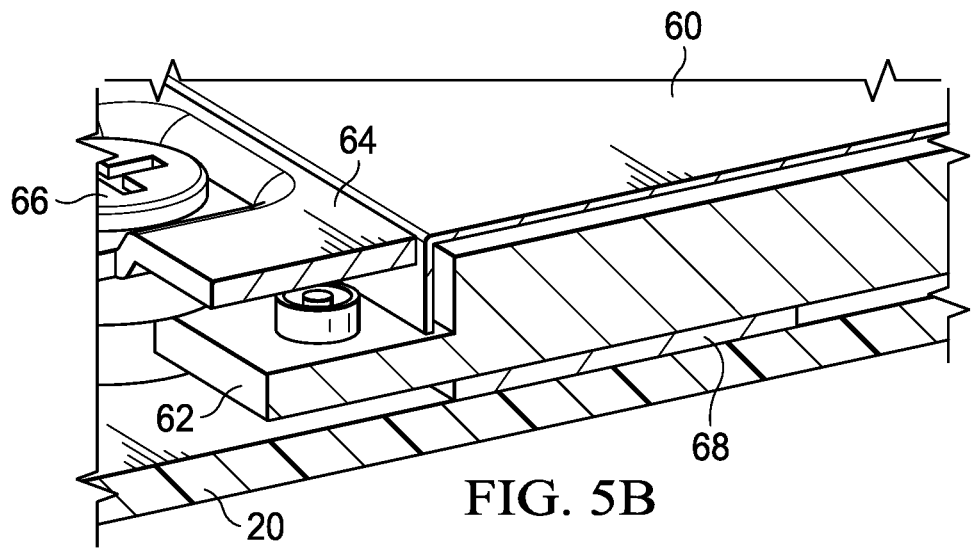
Figure 5C:
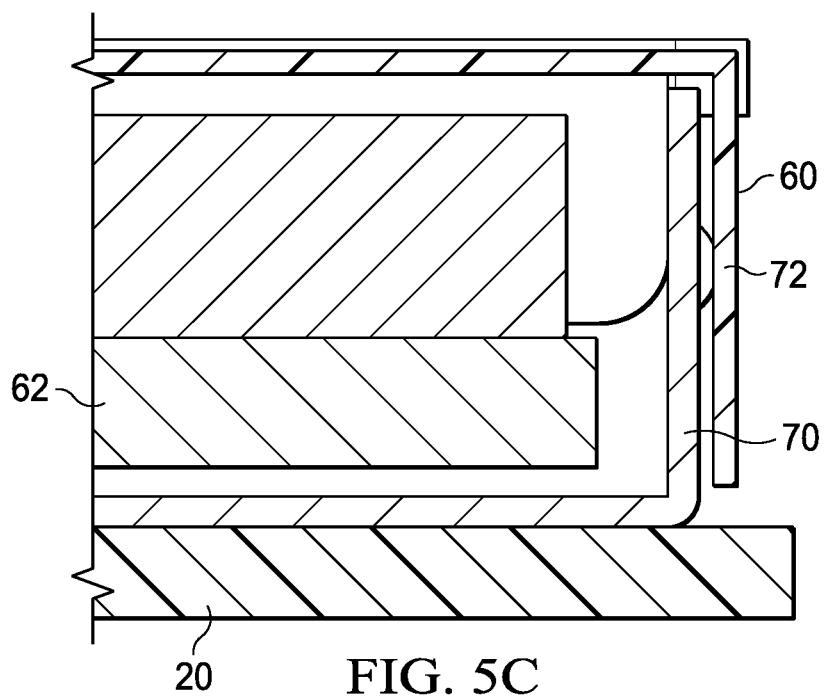
Figure 5D:
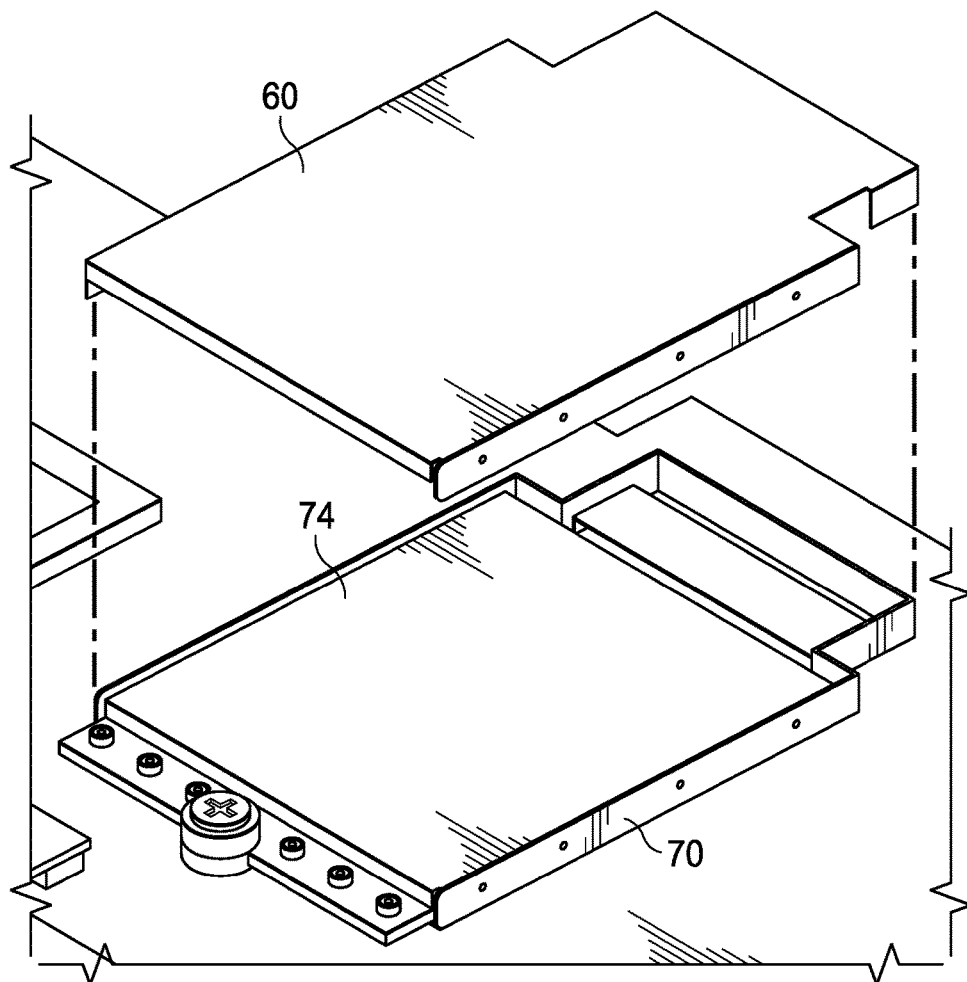

FIG. 5B depicts a side cutaway view of the EMI shield system coupled over a WNIC 34 electronic device that provides WWAN communication. Front face 64 folds downward to enclose WNIC 34 and a coupling device 66, such as a plate and screw, couples against front face 64 to both hold WNIC 34 in place and also provide a ground interface. A gasket 68 disposed between WNIC 34 and motherboard 20 has a conductive interface that connects shield 60 to ground of motherboard 20, such as through a ground interface of WNIC 34 exposed at the upper surface of motherboard 20. FIG. 5C depicts a side cutaway view of a multi-portion configuration of the EMI shield system that provides a ground interface with reduced leakage of EMI. A frame 70 is soldered down to motherboard 20 with a ground interface, such as a ground contact exposed at the upper surface of motherboard 20. An advantage of frame 70 is that it may be put on motherboard 20 with a surface mount technology (SMT), such as a pick and place machine that places frame 70 on solder paste interfaced with a motherboard ground contact. Frame 70 extends upwards from mother board 20 to provide a tight EMI leak protection and also a member onto which shield 60 couples. Shield 60 forms a slot that fits over the upward extending member of frame 70 and is held in place by a compression member 72 formed as a bump that presses out from frame 70. FIG. 5D depicts frame 70 placed on a motherboard 20 with shield 60 removed and an electronic device 74 coupled to motherboard 20 within a boundary defined by frame 70. The two-portion EMI shield system of a frame 70 and shield 60 provide a tight fit and minimized EMI leakage.

Figure 6:
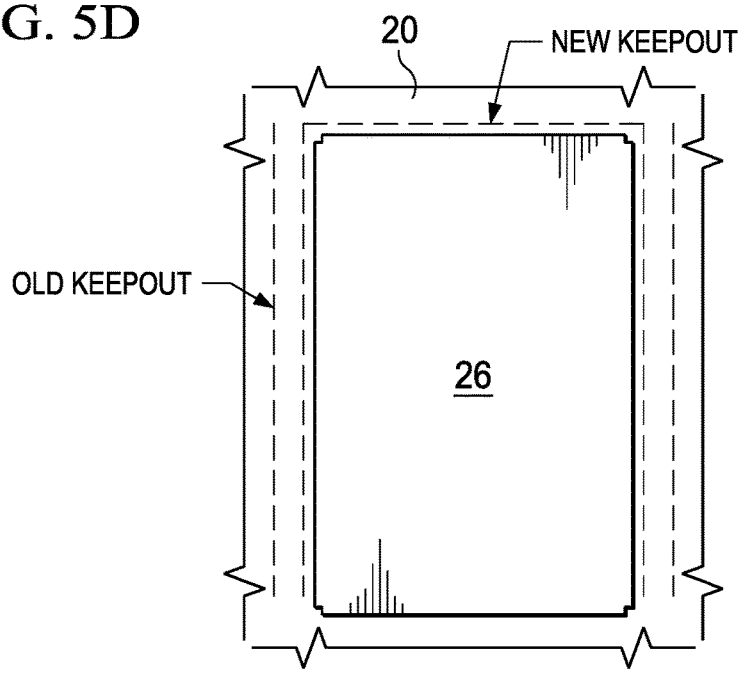
FIGS. 6, 6A, 6B and 6C depict an alternative embodiment of an EMI shield system having an M.2 connector.
Figure 6A:
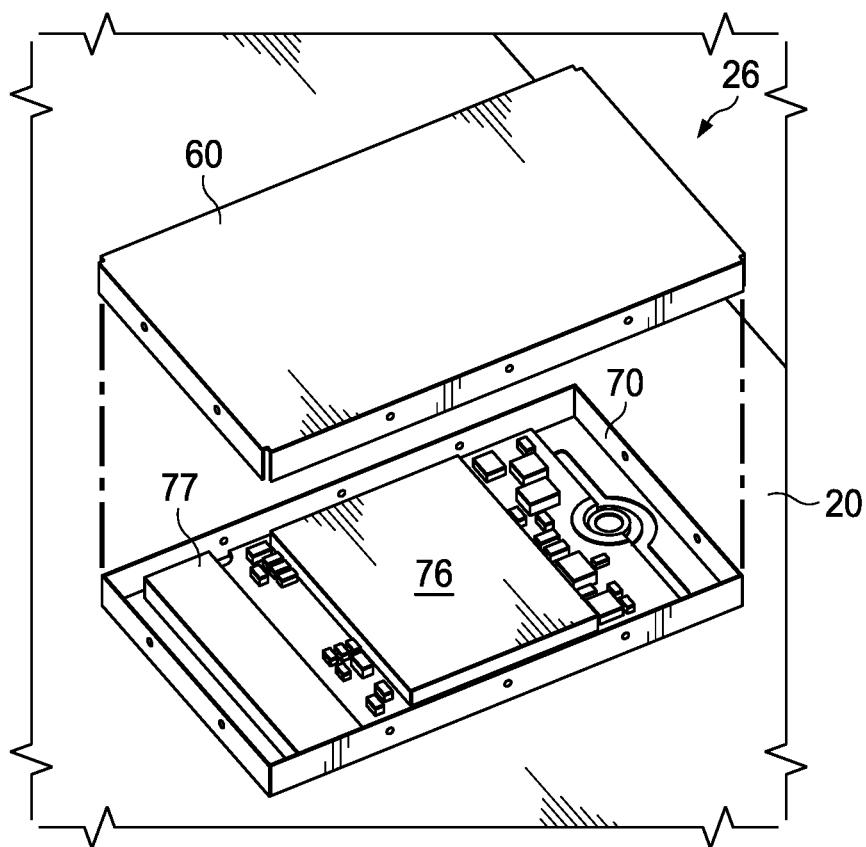
Figure 6B:
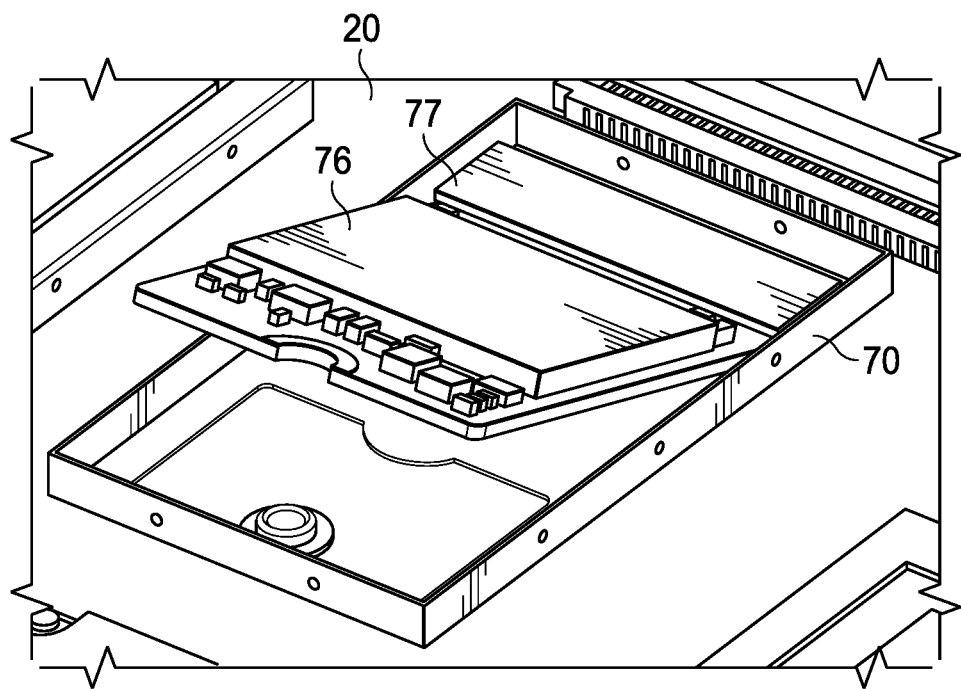
Figure 6C:
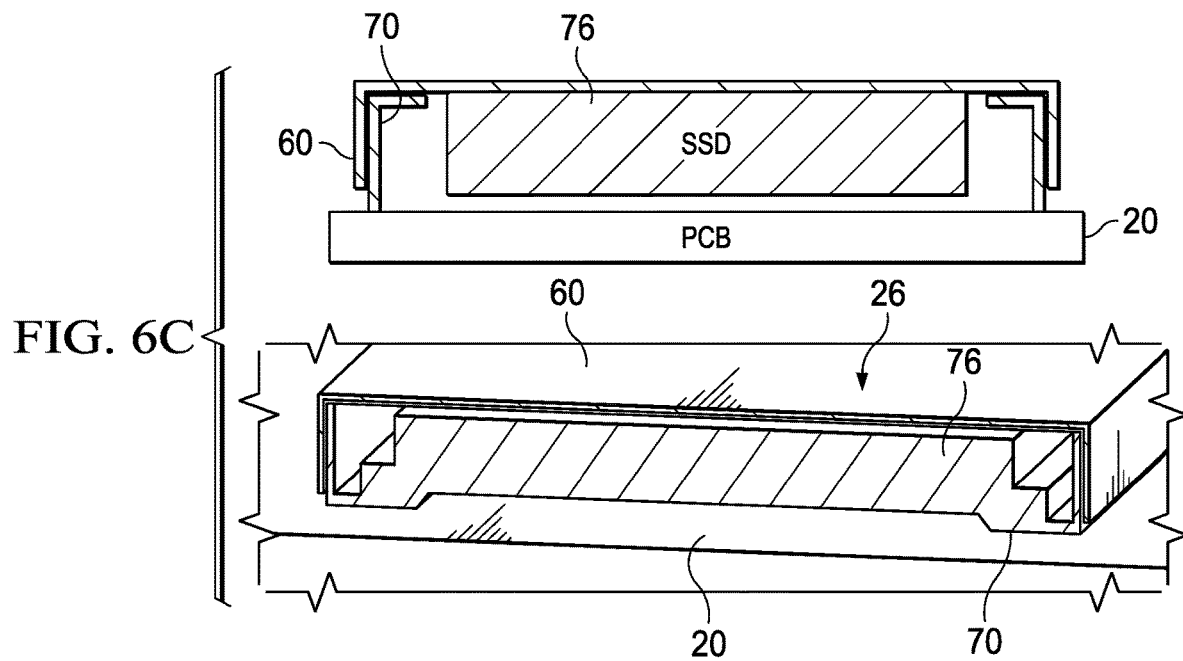

Referring now to FIGS. 6, 6A, 6B and 6C, an alternative embodiment of an EMI shield system is depicted having an M.2 connector. FIG. 6 depicts inner and outer boundaries that apply for placing an SSD electronic device on a motherboard 20. FIG. 6A depicts an SSD module 76 coupled to motherboard 20 with an M.2 connector 77 and enclosed by a frame 70 having the smaller inner boundary of FIG. 6 with shield 60 aligned to couple to frame 70 over SSD module 76. Frame 70 defines an EMI boundary around the placement of M.2 connector 77 so that coupling of shield 60 over top of frame 70 encloses both the M.2 connector and the SSD module. FIG. 6B depicts coupling of SSD module 76 into M.2 connector 77 with a sliding and downward movement so that SSD module 76 couples to M.2 connector 77 completely within frame 70, providing a leak free EMI shield system when shield 60 couples over frame 70. FIG. 6C depicts alternative arrangements of the EMI shield system to adjust the footprint boundary of an electronic component coupled motherboard 20. In one embodiment, frame 70 couples at motherboard 20 with a vertical member and forms an upper support with a horizontal member to which shield 60 couples to enclose SSD module 76, resulting in a larger overall footprint of the shielded electronic device on motherboard 20. By comparison an alternative embodiment having frame 70 with a horizontal member coupled to motherboard 20 and a vertical member coupling to shield 20 provides reduced overall footprint of an assembled and enclosed SSD 26. In the smaller footprint EMI enclosure, SSD module 76 rests an outer perimeter on frame 70 to have improved grounding interface.

Figure 7A:
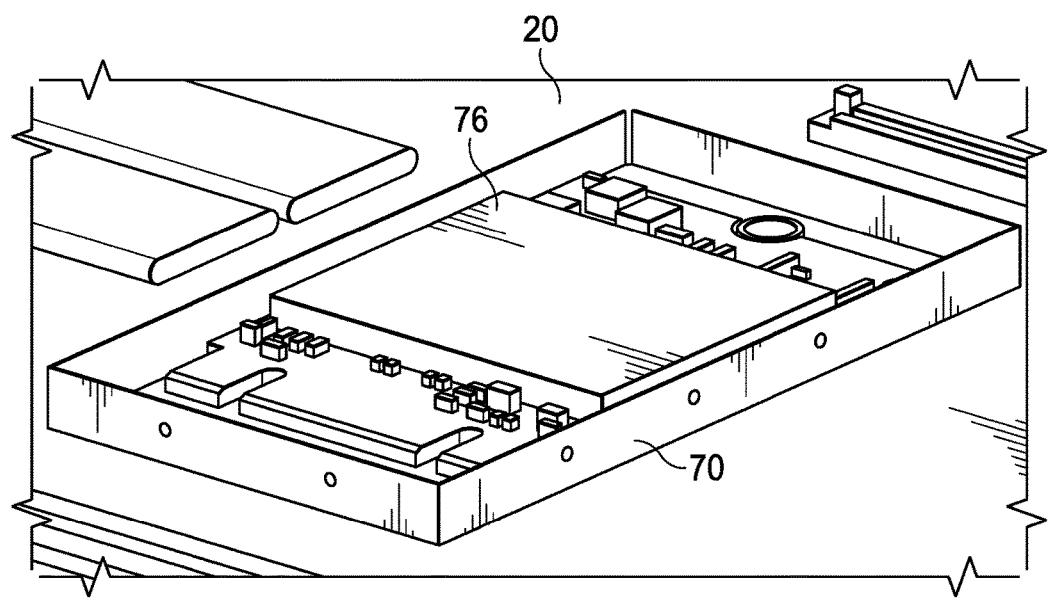
FIGS. 7A, 7B and 7C depict another alternative embodiment of an EMI shield system having a frame interfaced with system ground through a slot formed in a circuit board.
Figure 7B:
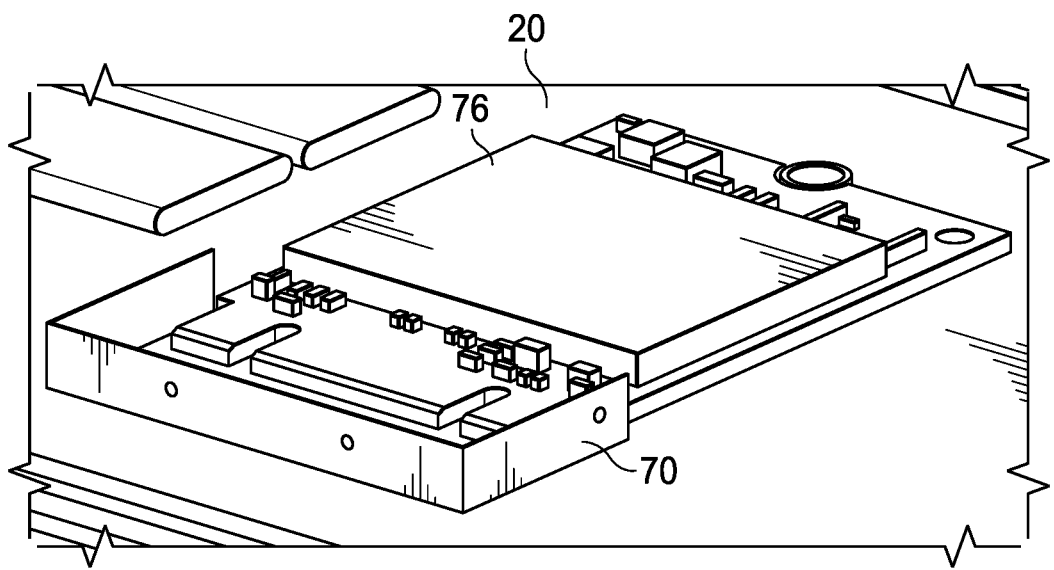
Figure 7C:
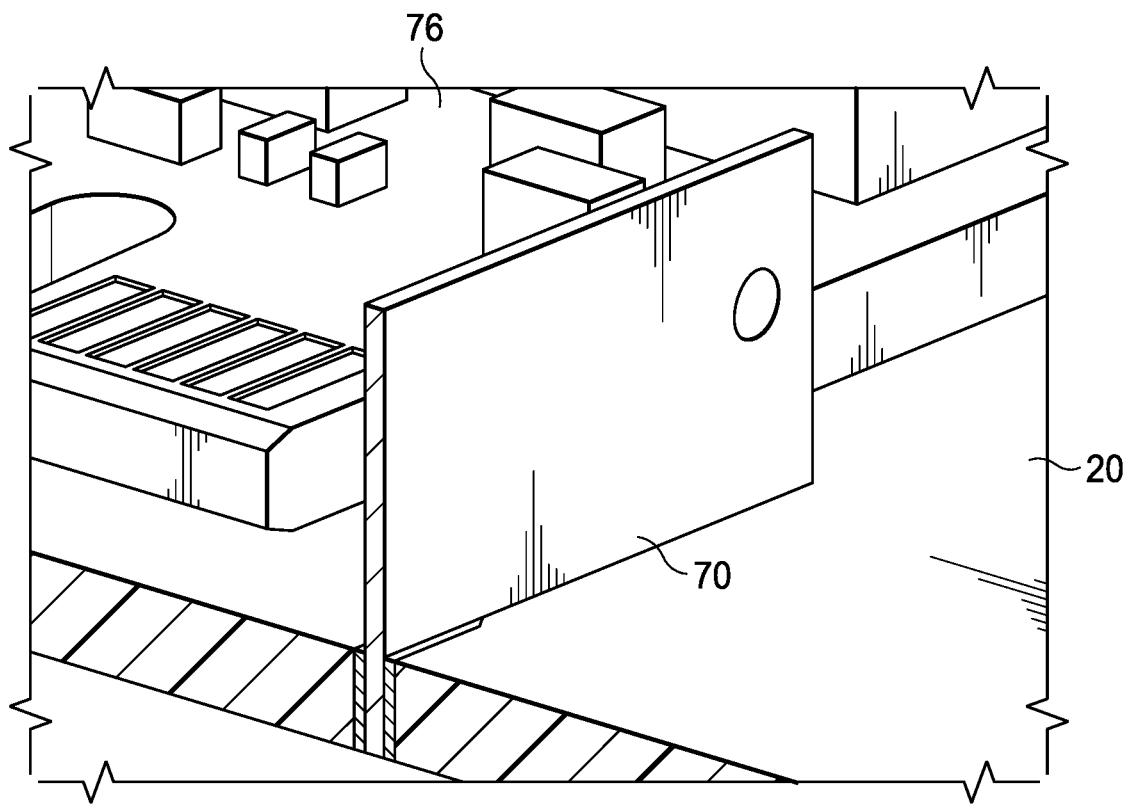

Referring now to FIGS. 7A, 7B and 7C, another alternative embodiment of an EMI shield system is depicted having a frame interfaced with system ground through a slot formed in a circuit board. FIG. 7A depicts SSD module 76 coupled to motherboard 20 within a frame 70 that defines a boundary around the entire footprint of SSD module 76. Completely enclosing the electronic device in the frame 70 with a connection at ground reduces EMI leakage. In addition, frame 70 may include some or all of its surface treated with graphene, which can help to translate thermal energy out of the enclosure through a thermal pathway defined by ground for dissipation through the motherboard ground plane. FIG. 7B depict an alternative embodiment having a frame 70 that only encloses the portion of the electronic device where the connector is located. In such an embodiment, a shield may couple to the partially-enclosed frame for support over top of the entire electronic device. FIG. 7C depicts an example embodiment having frame 70 inserted into a slot formed in motherboard 20 where frame 70 engages against a ground plane of motherboard 20, providing a tight EMI seal. For example, frame 70 may solder at the slot with the ground plane at the bottom surface of motherboard 20 so that the dielectric material of the motherboard does not have space to leak EMI.

Although the present invention has been described in detail, it should be understood that various changes, substitutions and alterations can be made hereto without departing from the spirit and scope of the invention as defined by the appended claims.

What is claimed is:

1. An information handling system comprising:
a housing;
a circuit board coupled to the housing and having a ground;
a processor disposed in the housing and interfaced with the circuit board, the processor operable to execute instructions that process information;
a memory disposed in the housing and interfaced with the circuit board, the memory operable to store the instructions and information;
a device connector coupled to the circuit board and interfaced with the processor, the device connector operable to accept an electronic device to communicate with the processor;
a frame coupled to the circuit board around the device connector and sized to accept the electronic device within the frame, the frame interfaced with the ground; and
a shield separate from the frame and configured to couple over the frame to enclose the electronic device, the shield coated at least over part of a surface with graphene paint.

2. The information handling system of claim 1 wherein:
the device connector is an M.2 connector; and
the electronic device comprises a solid state drive.

3. The information handling system of claim 1 wherein the electronic device comprises a radio.

4. The information handling system of claim 1 wherein:
the shield has inner and outer side surfaces that define a lip; and
the frame engages the shield in the lip and against the outer side surface with a compression member.

5. The information handling system of claim 1 wherein at least a portion of the frame fits into a slot formed in the circuit board to contact the ground.

6. The information handling system of claim 1 wherein the graphene paint covers only an outer surface of the shield.

7. The information handling system of claim 1 wherein the graphene paint covers all of both an inner and an outer surface of the shield.

8. The information handling system of claim 1 further comprising a ground gasket coupled to the circuit board under the electronic device and in contact with the shield and the ground exposed at the circuit board upper surface.

9. The information handling system of claim 8 wherein the frame is coated with graphene paint.

10. A method for coupling an electronic device to a circuit board within an information handling system housing, the method comprising:
coupling a device connector to the circuit board;
coupling a frame to the circuit board around the device connector, the frame having a perimeter sized to fit around an electronic device that couples to the device connector, the frame interfaced with a ground of the circuit board;
coupling the electronic device to the device connector within the frame;
painting graphene on a surface of a shield, the shield sized to couple to the frame; and
coupling the shield to the frame and over the electronic device to define a Faraday cage.

11. The method of claim 10 wherein:
the device connector is an M.2 connector; and
the electronic device comprises a solid state drive.

12. The method of claim 10 wherein the electronic devices comprise a radio.

13. The method of claim 10 further comprising:
forming a slot in the circuit board; and
inserting the frame in the slot to contact ground.

14. The method of claim 10 further comprising:
coupling a gasket to the circuit board under the electronic device, the gasket interfaced with the ground; and
contacting the shield against the gasket to interface the shield with ground.

15. The method of claim 10 wherein painting the shield further comprises painting both an interior surface and exterior surface of the shield.

16. An electromagnetic interference (EMI) shield system comprising:
a frame configured to couple against a circuit board interfaced with a ground of the circuit board;
a device connector configured to couple to the circuit board and to accept an electronic device; and
a shield configured to couple to the frame and enclose the device connector and electronic device, the shield painted over at least a portion of a surface with a graphene paint.

17. The EMI shield system of claim 16 wherein:
the device connector comprises an M.2 connector; and
the graphene paint covers only an exterior surface of the shield.

18. The EMI shield system of claim 16 wherein the graphene paint covers only an interior surface of the shield.

19. The EMI shield system of claim 16 wherein the graphene paint covers the entirety of the interior and exterior of the shield.

20. The EMI system of claim 16 further comprising a gasket configured to lay between the electronic device and the circuit board to interface with ground, the gasket contacting the shield to interface the shield with ground.

* * * * *